United States Patent [19]

Ecklund

[11] Patent Number: 5,050,237
[45] Date of Patent: Sep. 17, 1991

[54] RADIO RECEIVER HAVING AUTOMATIC BANDWIDTH CONTROL DURING TUNING

[75] Inventor: Lawrence M. Ecklund, Wheaton, Ill.

[73] Assignee: Motorola, Inc., Schaumburg, Ill.

[21] Appl. No.: 415,372

[22] Filed: Sep. 27, 1989

Related U.S. Application Data

[63] Continuation of Ser. No. 145,335, Jan. 19, 1988, abandoned.

[51] Int. Cl.$^5$ .............................................. H04B 1/16
[52] U.S. Cl. .................................. 455/200; 455/266; 455/295; 381/12; 381/15
[58] Field of Search ............... 455/183, 200, 266, 295, 455/296, 309, 177, 202–204, 338–340; 329/129, 132, 135; 381/12, 13, 15

[56] References Cited

U.S. PATENT DOCUMENTS

| | | | |
|---|---|---|---|
| 4,356,568 | 10/1982 | Ogita et al. | 455/266 |
| 4,429,279 | 1/1984 | Wycoff et al. | 455/266 |
| 4,455,674 | 6/1984 | Sano | 455/266 |
| 4,563,651 | 1/1986 | Ohta et al. | 455/266 |
| 4,598,426 | 7/1986 | Shiojima | 455/266 |
| 4,680,795 | 7/1987 | Ecklund | 381/15 |
| 4,688,254 | 8/1987 | Ecklund | 381/15 |
| 4,712,241 | 12/1987 | Ecklund | 381/15 |

Primary Examiner—Curtis Kuntz
Attorney, Agent, or Firm—Steven G. Parmelee

[57] ABSTRACT

In this radio receiver, the charge on a capacitor (14) controls the bandwidth of filters in the receiver's audio circuits. When tuning the radio, a bandwidth control circuit (13) forces this capacitor (14) to discharge, thereby forcing the audio path to be bandwidth restricted, thereby minimizing interstation noise reproduction.

4 Claims, 1 Drawing Sheet

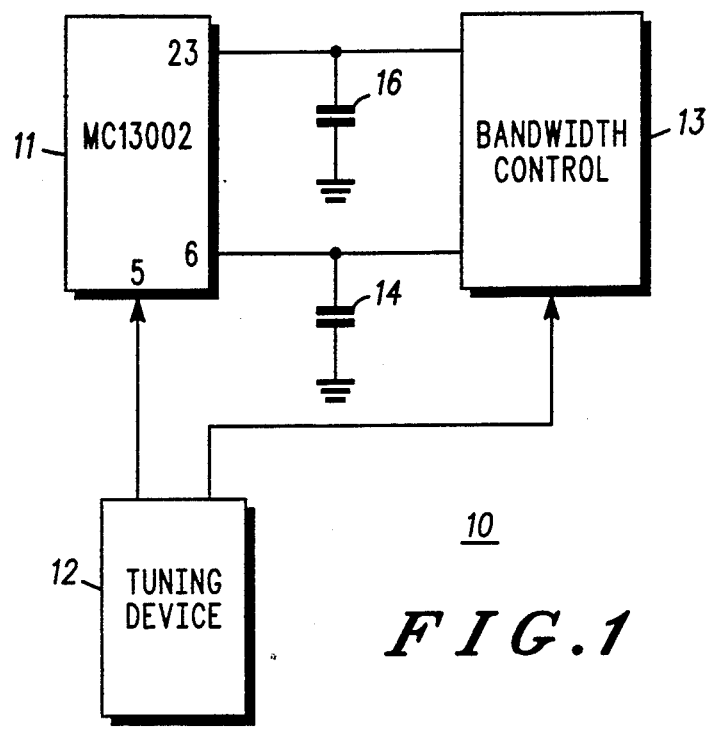
FIG.1
FIG.2
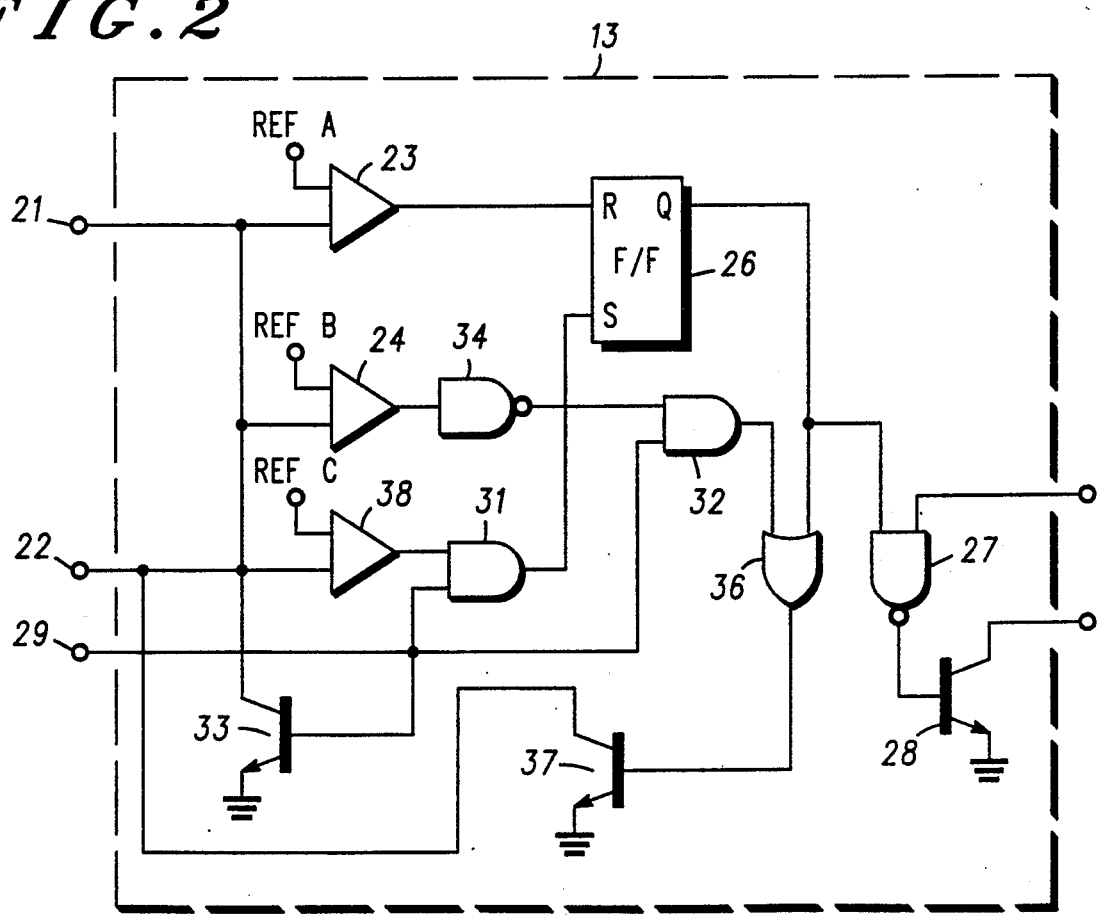

RADIO RECEIVER HAVING AUTOMATIC BANDWIDTH CONTROL DURING TUNING

This is a continuation of application Ser. No. 07/145,335, filed Jan. 19, 1988, and now abandoned.

TECHNICAL FIELD

This invention relates generally to radio receivers, and particularly to AM radio receivers.

BACKGROUND ART

Radio receivers are well known in the art. Such receivers function to receive broadcast RF signals. Receivers typically include a tuning mechanism that can select a particular broadcast signal of interest, which can then be demodulated by the radio to yield an audible information signal.

When tuning to a broadcast station of interest, the receiver will typically respond to between channel signals of various kinds that result in a variety of annoying audible noises. A need exists for a way to reduce interstation noise output while tuning such a radio.

SUMMARY OF THE INVENTION

These needs are substantially met through provision of the radio receiver disclosed herein. In this radio, a bandwidth control unit is provided for controlling the bandwidth of the audible signal output from radio. A trigger unit provides a trigger signal when the radio is not tuned to a broadcast signal of interest (i.e., when the radio is presumably being tuned to such a station but is currently between stations), and a control unit responds to this trigger signal by causing the bandwidth control unit to minimize the bandwidth of the audible signal path until a broadcast signal of interest has been tuned. Once an acceptable signal has been located, the bandwidth can be increased to allow normal functioning of the radio.

In one embodiment of the invention, the bandwidth of the audible signal path can be controlled through use of a variable Q filter.

BRIEF DESCRIPTION OF THE DRAWINGS

FIG. 1 comprises a block diagram view of the invention; and

FIG. 2 comprises a schematic view of the bandwidth control features of the invention.

BEST MODE FOR CARRYING OUT THE INVENTION

Referring now to the drawings, and in particular to FIG. 1, the invention can be seen as depicted generally by the numeral 10. The invention (10) can include, in this embodiment, an AM stereo decoder (11) such as the MC13022 as manufactured by Motorola, Inc.

To yield a completely operable receiver, of course, it would be necessary to include other known components connected in an appropriate manner to various output pins of the decoder (11). Such configurations, however, are well understood in the art, and their inclusion here would not necessitate a better understanding of the invention. Therefore, for the sake of brevity and clarity, these other components and connections will not be displayed or discussed here.

The invention also generally includes a tuning device (12) of choice and a bandwidth control unit (13). The tuning device (12) may be a mechanical tuning structure (such as a variable capacitor mechanism that is hand operated) an electronically controlled tuning mechanism, or any other tuning mechanism of choice. The IF output of the tuning device is provided to the IF input (pin 5) of the decoder (11). An output from the tuning device (12) is also provided to the bandwidth control unit (13). This output provides an indication signal of when the tuning device (12) is in the act of tuning. This indication could of course be any of a variety of signals, depending upon the particular tuning device selected and the needs of the application The decoder (11) includes a stop sense port (pin 6) that connects to an appropriate capacitor (14). Similarly, a blend port (pin 23) for the decoder (11) connects to a capacitor (16). The capacitor (16) on the blend port (pin 23) supports a wide number of functions in the MC13022 (11). Additional information regarding these functions can be found in Ser. No. 121,361 filed on Nov. 16, 1987 entitled "Multiple Function Control Circuit For An AM Stereo Receiver," and in U.S. Pat. No. 4,688,254 as issued on Aug. 18, 1987 entitled "Controlled Blend For AM Stereo Receivers.") The bandwidth control unit (13) also connects to both capacitors (14 and 16), and is able to control certain operating characteristics of the decoder (11) through these connections The decoder (11) includes a variable Q filter in its audio processing circuitry. (Detailed information regarding this filter can be found in U.S. Pat. No. 4,680,795 as issued on July 14, 1987 entitled "Dual Purpose Variable Q Filter." The contents of this patent are incorporated herein by this reference.) This variable Q filter functions in the decoder (11) to control the bandwidth of the audio circuit as a function of an AGC circuit also included therein. The filter also functions to provide a 10 KHz notch to minimize adjacent channel interference. As described below in more detail, this invention (10) provides the bandwidth control unit (13) to also cause this variable Q filter to restrict the bandwidth of the audio path when the radio is being tuned to minimize interstation noise.

Referring now to FIG. 2, the bandwidth control unit (13) will be described in more detail.

When tuned to a station, the blend capacitor (16) will present a charge of at least 0.7 volts to a blend port (22), and the stop sense capacitor (14) will present a high signal (i.e., greater than 1.5 volts) at a stop sense port (21). A first and second comparator (23 and 24) receive the stop sense voltage. The first comparator (23) provides a high output whenever the stop sense voltage exceeds 1.5 volts. The second comparator (24) provides a high output whenever the stop sense voltage exceeds 0.4 volts. When tuned to a station, the outputs of both comparators (23 and 24) will therefore be high.

As a result, the first comparator (23), which connects to the reset port of a flip-flop (26), will cause the Q output thereof to be low. A first NAND gate (27) inverts this low output to cause a first transistor (28) to switch on and thereby cause a lamp (not shown) to be energized. Such a lamp would indicate to the user when the radio has been tuned to a broadcast station.

When the operator begins to tune the radio to another station, an appropriate tuning indicator can be provided at the input port (29) provided for this signal. This tuning indication signal will present an enabling signal to two AND gates (31 and 32), and will also switch a second transistor (33) on. When switched, the latter transistor (33) will begin to discharge the stop sense capacitor (14).

When the stop sense capacitor (14) has been discharged to less than 1.5 volts, the first comparator (23) will remove the reset signal from the flip-flop (26). When the stop sense capacitor (14) has been discharged to less than 0.4 volts, the second comparator (24) will provide a switching signal through a second NAND gate (34) to the already enabled second AND gate (32). This second AND gate (32) will then provide a high signal through an OR gate (36) to cause a third transistor (37) to switch on and thereby cause the blend capacitor (16) to be discharged.

When the blend capacitor (16) has discharged to less than 0.4 volts, as ascertained by a third comparator (38), a high signal will be provided to the already enabled first AND gate (31) to thereby provide a set signal to the flip-flop (26). This will cause the flip-flop (26) to provide a high output signal to both the OR gate (36) and the first NAND gate (27). The latter gate (27) will then cause the first transistor (28) to switch off and thereby extinguish the tuning lamp.

The decoder (11) operates such that discharging the stop sense capacitor (14) will cause the variable Q filters in the decoder (11) to fully minimize the bandwidth of the audio channels. Since the bandwidth control circuit (13) causes the stop sense capacitor (14) to discharge when the radio is tuning, the audio path will be substantially restricted with respect to bandwidth while tuning, thereby minimizing unwanted sounds caused by interstation noise.

Once the tuning process has been fully begun, the signal as provided to the tuning signal port (29) of the bandwidth control circuit (13) can again go low. This will disable the two AND gates (31 and 32) and the second transistor (33). As a result, the stop sense capacitor (14) will be allowed to charge when a station has been tuned. The blend capacitor (16) remains fully discharged to prevent premature presentation of an attempted stereo signal. When a station has been tuned, the stop sense capacitor (14) voltage will rise, and eventually exceed 1.5 volts and thereby cause the first comparator (23) to reset the flip-flop (26) and thereby switch off the third transistor (37). When this occurs, the blend capacitor (14) is thereafter allowed to operate in an ordinary manner. Also, when the flip-flop (26) resets, the first transistor (28) will again be switched on to ignite the tuned lamp and thereby provide a visible indication to the user that the radio is tuned.

I claim:

1. In a radio receiver having:
RF means for receiving broadcast signals of interest;
tuning means for selecting a particular broadcast signal of interest;
demodulation means for demodulating said particular broadcast signal of interest to obtain an information signal; and
audio means for rendering said information signal into an audible signal,
an improvement comprising:
A) bandwidth means for controlling bandwidth of said audible signal, but not for affecting bandwidth of the particular broadcast signal of interest in the RF means and tuning means, and not for affecting bandwidth of the information signal in the demodulation means;
B) trigger means for providing a trigger signal when said tuning means is not tuned to a broadcast signal of interest; and
C) control means for responding to said trigger signal by causing said bandwidth means to minimize bandwidth of said audible signal until a broadcast signal of interest has been tuned.

2. The improvement of claim 1 wherein said bandwidth means comprises a variable Q filter.

3. The improvement of claim 2 wherein said variable Q filter is operably associated with said audio means.

4. In a radio receiver that receives broadcast signals and converts said broadcast signals into audio signals, a method of minimizing interstation noise while tuning a broadcast signal for reception, comprising the steps of:
A) detecting when said radio receiver is not tuned to a broadcast signal;
B) reducing bandwidth of said audio signals, but not reducing bandwidth of non-audio signals when said radio receiver is not tuned to a broadcast signal; and
C) allowing said bandwidth of said audio signals to increase when said radio receiver becomes tuned to a broadcast signal.

* * * * *